US007675927B2

(12) United States Patent
Batchelor et al.

(10) Patent No.: US 7,675,927 B2
(45) Date of Patent: Mar. 9, 2010

(54) TRACE INFORMATION QUEUEING SYSTEM

(75) Inventors: Gary W. Batchelor, Tucson, AZ (US); Ronald J. Chapman, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 1244 days.

(21) Appl. No.: 10/871,757

(22) Filed: Jun. 17, 2004

(65) Prior Publication Data

US 2005/0281201 A1    Dec. 22, 2005

(51) Int. Cl.
 *H04L 12/28*    (2006.01)
(52) U.S. Cl. .................... 370/412; 370/429; 370/503
(58) Field of Classification Search .............. 370/254, 370/255, 241–248, 252, 412, 419, 429, 503, 370/538, 517–520, 540, 535, 542; 365/189.05; 702/119, 120, 122, 184; 714/724, 725, 734, 714/731; 324/73.1; 326/16, 37–39, 41, 47; 327/201, 208, 212, 218; 375/356, 359, 360, 375/368, 371, 372, 373, 375, 376; 340/825.83, 340/825.84; 361/760–783; 716/15–17; 439/55, 439/493, 541.5, 581, 620.12, 620.15, 620.2, 439/620.22, 620.24, 620.25, 620.945, 620.947, 439/920.951
See application file for complete search history.

(56) References Cited

U.S. PATENT DOCUMENTS

| 4,945,516 | A | * | 7/1990 | Kashiyama | 365/189.05 |
| 5,844,844 | A | * | 12/1998 | Bauer et al. | 365/189.05 |
| 6,151,257 | A | * | 11/2000 | Jeffrey et al. | 365/189.05 |
| 6,650,696 | B1 | * | 11/2003 | Lin et al. | 375/219 |
| 6,777,980 | B2 | * | 8/2004 | Young et al. | 326/41 |
| 2003/0084388 | A1 | * | 5/2003 | Williamson et al. | 714/725 |

* cited by examiner

*Primary Examiner*—Ian N Moore
(74) *Attorney, Agent, or Firm*—Quarles & Brady LLP

(57) ABSTRACT

A trace information queueing system receives a plurality of trace information signals and transmits them through a common connector. The multiple trace information signals may be multiplexed. Each edge of a clock signal may be used to enable transmission of different trace information signals. Alternatively, separate clocks signals may be provided for each trace information signal. A programmable logic device may be used to both multiplex the trace information signals and produce the clock signals necessary to enable their transmission.

13 Claims, 6 Drawing Sheets

TRACE INFORMATION QUEUEING SYSTEM

BACKGROUND OF THE INVENTION

1. Field of the Invention

This invention is related in general to the field of information handling systems. In particular, the invention consists of a method of transmitting status information from a multitude of electronic devices over a common connector.

2. Description of the Prior Art

Electronic systems, such as printed circuit boards with numerous electronic components, can generate trace information that may be transmitted to other circuit boards, other electronic systems, other locations, or even a central monitoring station. This trace information may include an indication of the condition of the electronic components, their arrangement within the electronic system, their current activity, the contents of memory registers within the electronic components, or whether electric faults such as open or shorted circuits exists.

One example of this type of system is a printed circuit board containing multiple electronic components that include programmable input/output pins. Using a technique known as boundary scan, instructions may be loaded into the programmable components that instruct the programmable pins to transmit logic high, logic low, and high impedance signals. Other programmable pins may be instructed to simultaneously accept these transmitted signals as inputs. The result of this transmission and concurrent reception may be passed to an external connector on the printed circuit board. This external connector may be monitored to determine the status of the programmable electronic components or the connections between them.

Tracing of electronic equipment becomes more difficult as electronic system bus widths and clock speeds increase, and as the number of electric traces and number of component conditions increase. The major bottleneck for obtaining more information is the amount of information that may be transmitted through the external connector. Due to the limited bandwidth of a traditional connector, tracing is generally limited to a subset of the information of interest. This results in potentially useful information being inaccessible. Accordingly, it would be advantageous to increase the amount of trace information that may be transmitted through a connector.

SUMMARY OF THE INVENTION

The invention disclosed herein is a method of simultaneously queueing and transmitting multiple sets of trace information through a common connector. Using existing connector pins, sets of trace data can be sent to a queueing device such as a multiplexor. Each set of trace data is associated with its own clock signal. Successive data that form a trace set are transmitted only during the transition of their corresponding clock signal.

One aspect of this invention is that simple electronic components may be utilized to increase trace data transmission. For example, a simple double-clocked latch and a single clock signal may be used to simultaneously transmit two disparate trace data streams, effectively doubling the bandwidth of an associated connector. This is accomplished by running the clock signal through an inverter and connecting the original clock and inverted clock to separate enable pins on the double-clocked latch. In a positive edge-triggered latch, the first trace data stream is transmitted when the original clock goes high. The second trace data stream is transmitted when the original clock signal goes low, resulting in the inverted clock signal going high.

Another aspect of the invention is that disparate trace information may be transmitted on different edges of the same clock signal. For example, a multiplexor may be designed to transmit data arriving at a first input pin during a positive edge of the clock signal and to transmit data arriving at a second input pin during a negative edge of the clock signal. Another benefit of the invention is that multiple clock signals may be used to enable the throughput of disparate trace information. Additionally, the invention can be adapted to include trace information signals that are more than one bit wide, i.e., data arriving on an 8-bit, 16-bit, 32-bit, or 64-bit bus.

Various other purposes and advantages of the invention will become clear from its description in the specification that follows and from the novel features particularly pointed out in the appended claims. Therefore, to the accomplishment of the objectives described above, this invention comprises the features hereinafter illustrated in the drawings, fully described in the detailed description of the preferred embodiments and particularly pointed out in the claims. However, such drawings and description disclose just a few of the various ways in which the invention may be practiced.

DESCRIPTION OF THE PREFERRED EMBODIMENTS

Figure 1A:
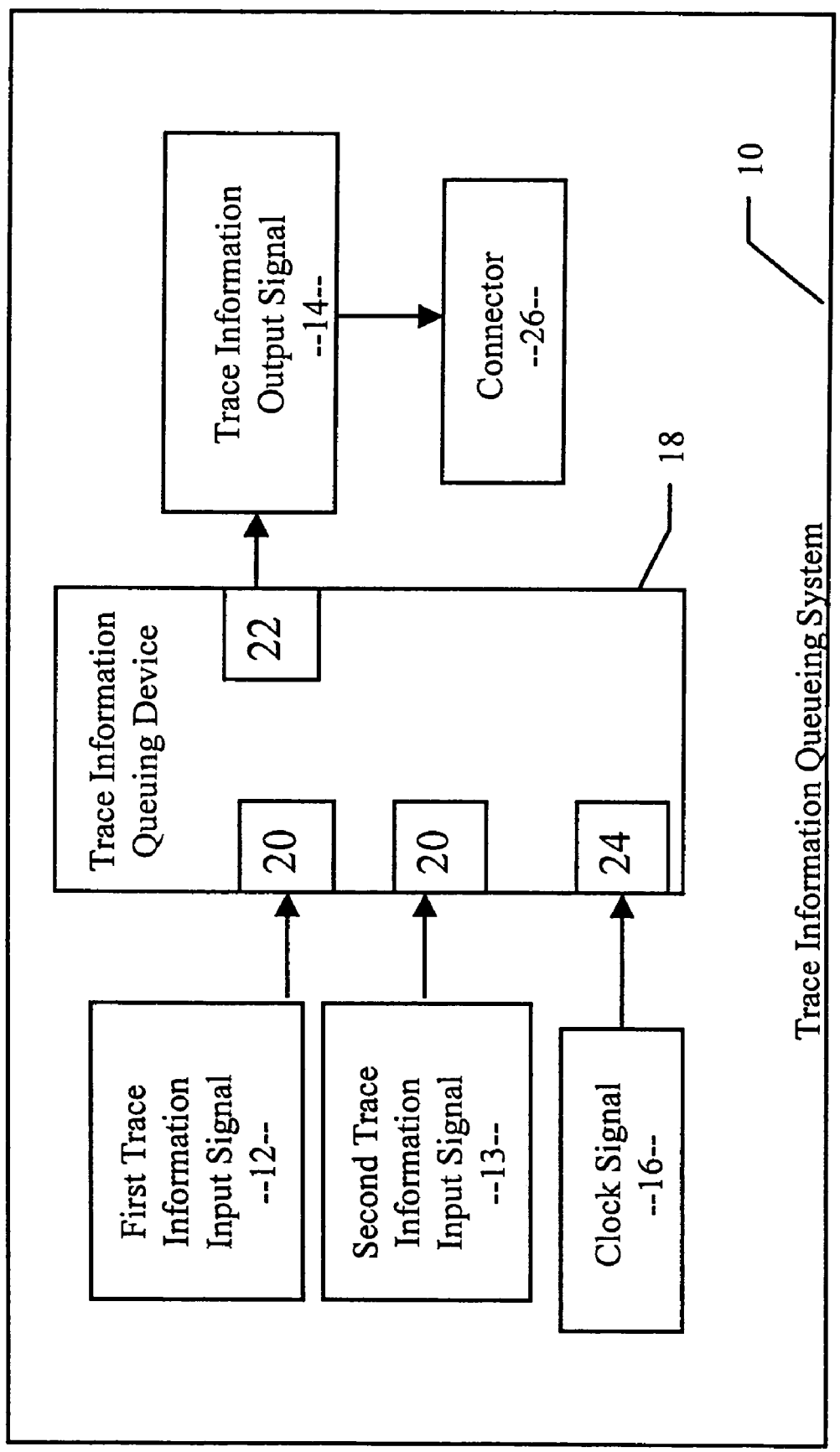
FIG. 1A is a block diagram of a trace information queueing system in accordance with the invention including a single clock signal, multiple trace information input signals, and a queueing device including a single enable pin, multiple data inputs, and a single trace information output signal.

This invention is based on the idea of using a queueing device, such as a multiplexor, to transmit trace data along with a clock to multiplex multiple data images to align with different clock edges. The invention may be implemented as a method, apparatus or article of manufacture using standard programming or engineering techniques to produce software, firmware, hardware, or any combination thereof. The term "article of manufacture" as used herein refers to code or logic implemented in hardware or computer readable media such as optical storage devices, and volatile or non-volatile memory devices. Such hardware may include, but is not limited to, field programmable gate arrays (FPGAs), applicationspecific integrated circuits (ASICs), complex programmable logic devices (CPLDs), programmable logic arrays (PLAs), microprocessors, or other similar processing devices.

Referring to the figures, wherein like parts are designated with the same reference numerals and symbols, FIG. 1 is a block diagram illustrating a trace information queueing system 10 including multiple trace information input signals 12, 13 a single trace information output signal 14, at least one clock signal 16, and a queueing device 18 including multiple inputs 20, a single output 22, and at least one transmission enable pin 24. The trace information queueing system may include a connector 26 for transmitting the trace information output signal.

The trace information queueing device 18 may be either a hardware device or a computer processing device programmed to accept multiple trace information signals and output a single trace information signal. If the queueing device 18 is a programmable logic device such as an FPGA, the clock signals may be generated internally, eliminating the need for the external clock signal 16 and the enable pin 24. Additionally, an algorithmic construct residing within the computer processing device may be dynamically adaptive, e.g., providing additional internal clock signals in response to receiving additional concurrent trace information input signals.

In this embodiment of the invention, multiple trace information input signals 12, 13 arrive at the queueing device 18. These trace information input signals normally contain information in a digital format, however the queueing system 10 may be adapted to work with analog information as well. The trace information input signals 12, 13 are multiplexed through the signal output 22 based on triggering events. In this embodiment of the invention, the triggering event is either a rising edge or a falling edge of the clock signal 16. When the clock signal transitions from low to high, a datum of the first trace information signal 12 is transmitted through the output pin 22 to the connector 26. When the clock signal transitions from high to low, a datum of the second trace information signal 13 is transmitted. In this manner, both trace information signals 12, 13 are transmitted using a single clock signal 16 as the triggering event.

If the enabling pin 24 is allowed to recognize more than two states, then additional trace information signals may be multiplexed with this clock signal. For example, if the enabling pin 24 is adapted to recognize zero to 2.4 volts as a logic low, 2.5 to 3.5 volts as a logic mid, and 3.6 volts and over as a logic high, then as many as three trace information signals may be multiplexed by this device.

Figure 1B:
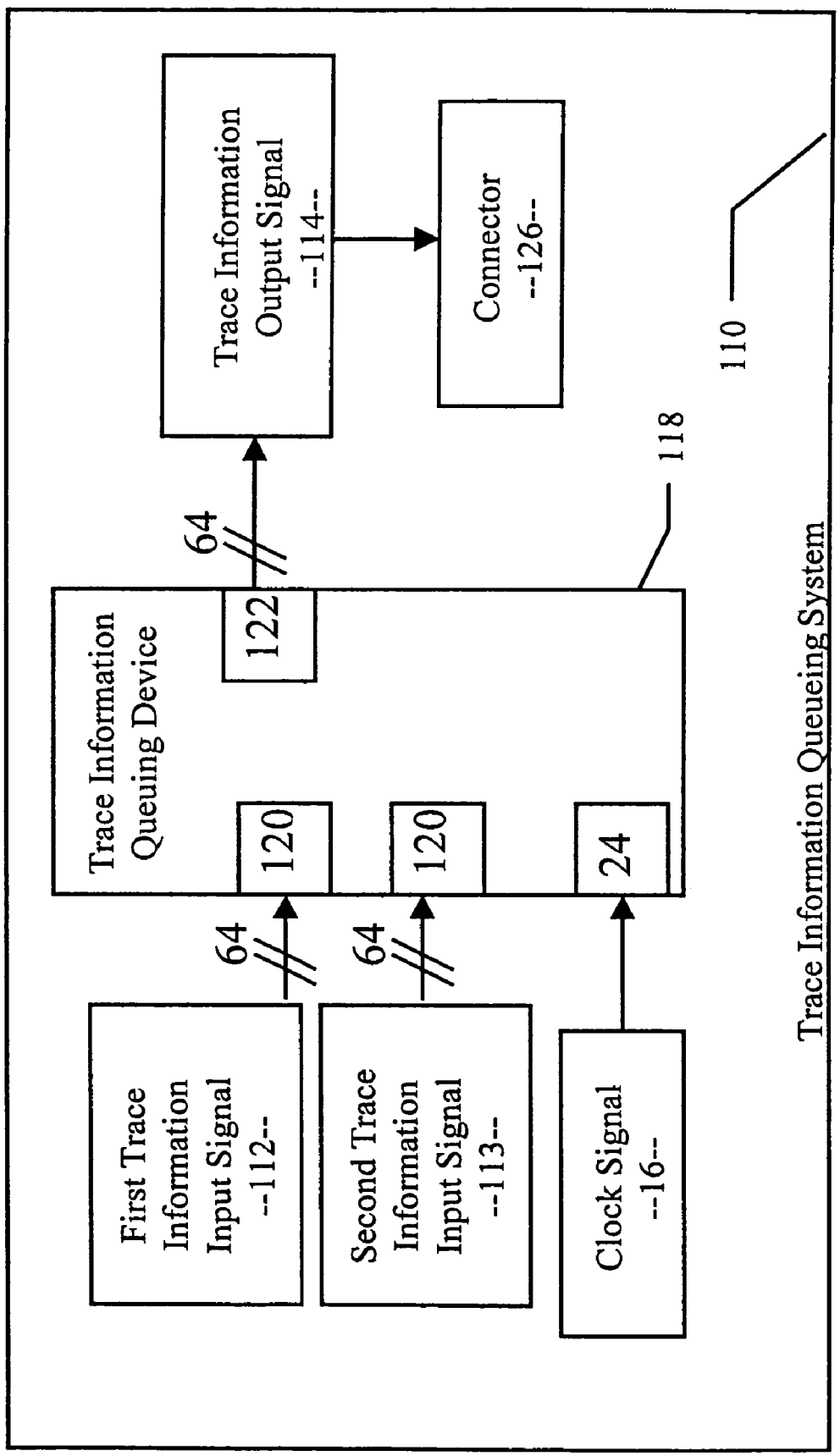
FIG. 1B is a block diagram of the trace information queueing system of FIG. 1 wherein each trace information signal includes a plurality of electric signals traveling over a bus formed of a plurality of signal pathways

Referring to FIG. 1B, a block diagram illustrates a trace information queueing system 110 similar to that of FIG. 1A. However, the queueing device 118 has been adapted to accept trace information signals 112, 113 that include more than one electric signal. In this example, 64-bit buses are used to transport the trace information signals 112, 113, 114 and the connector 126 has been adapted to simultaneously transmit 64 electric signals. Additionally, the inputs 120 and outputs 122 of the queuing device 118 have been enlarged to 64 pins. These modifications allow the trace information queueing system 110 to work with trace information signals that are many bits wide. However, buses such as these are usually a power of two such as 8, 16, 32, 64, or 128.

Figure 2:
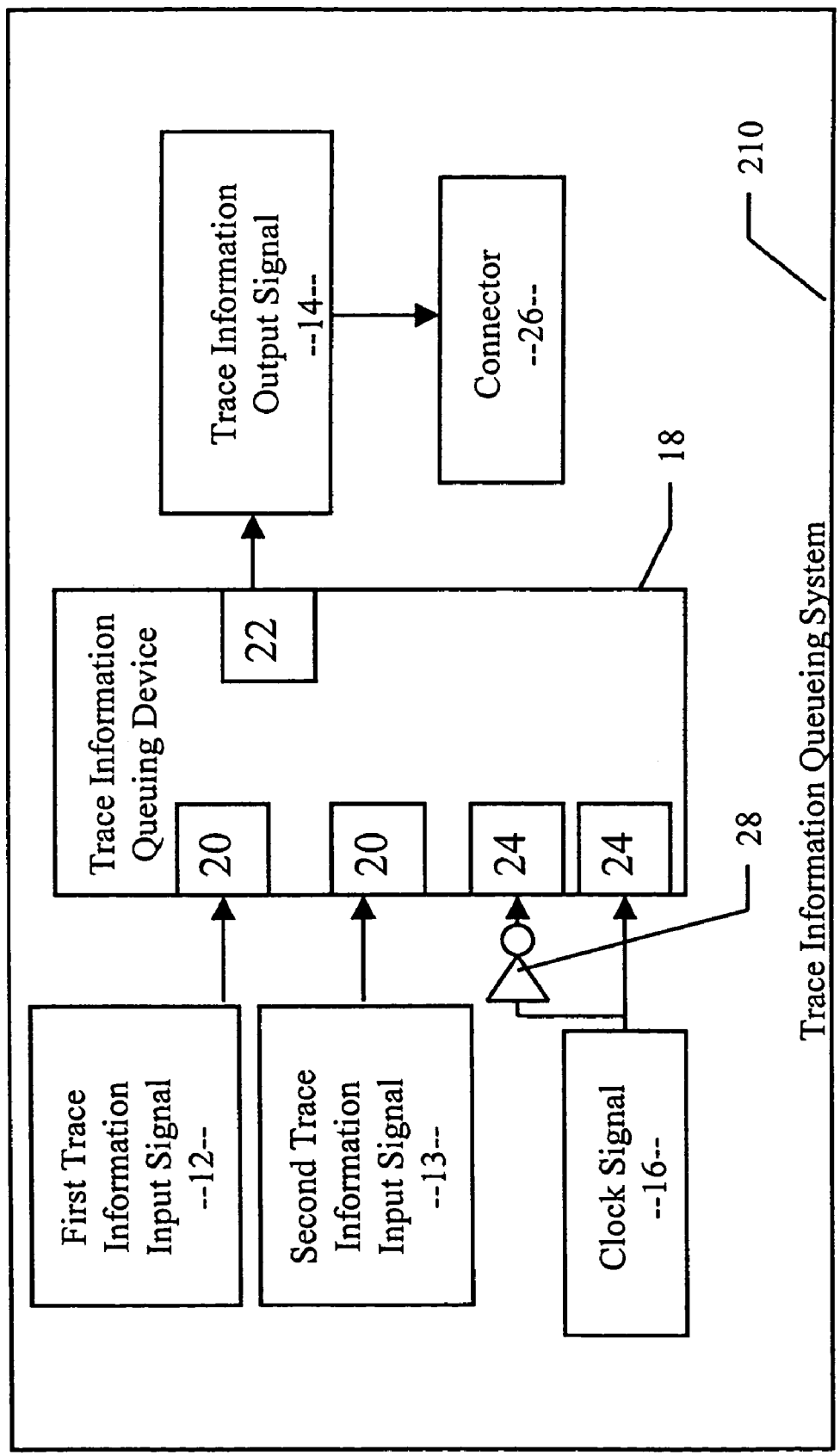
FIG. 2 is a block diagram of the trace information queueing system of FIG. 1 including an inverter and a second enable pin.
Figure 3:
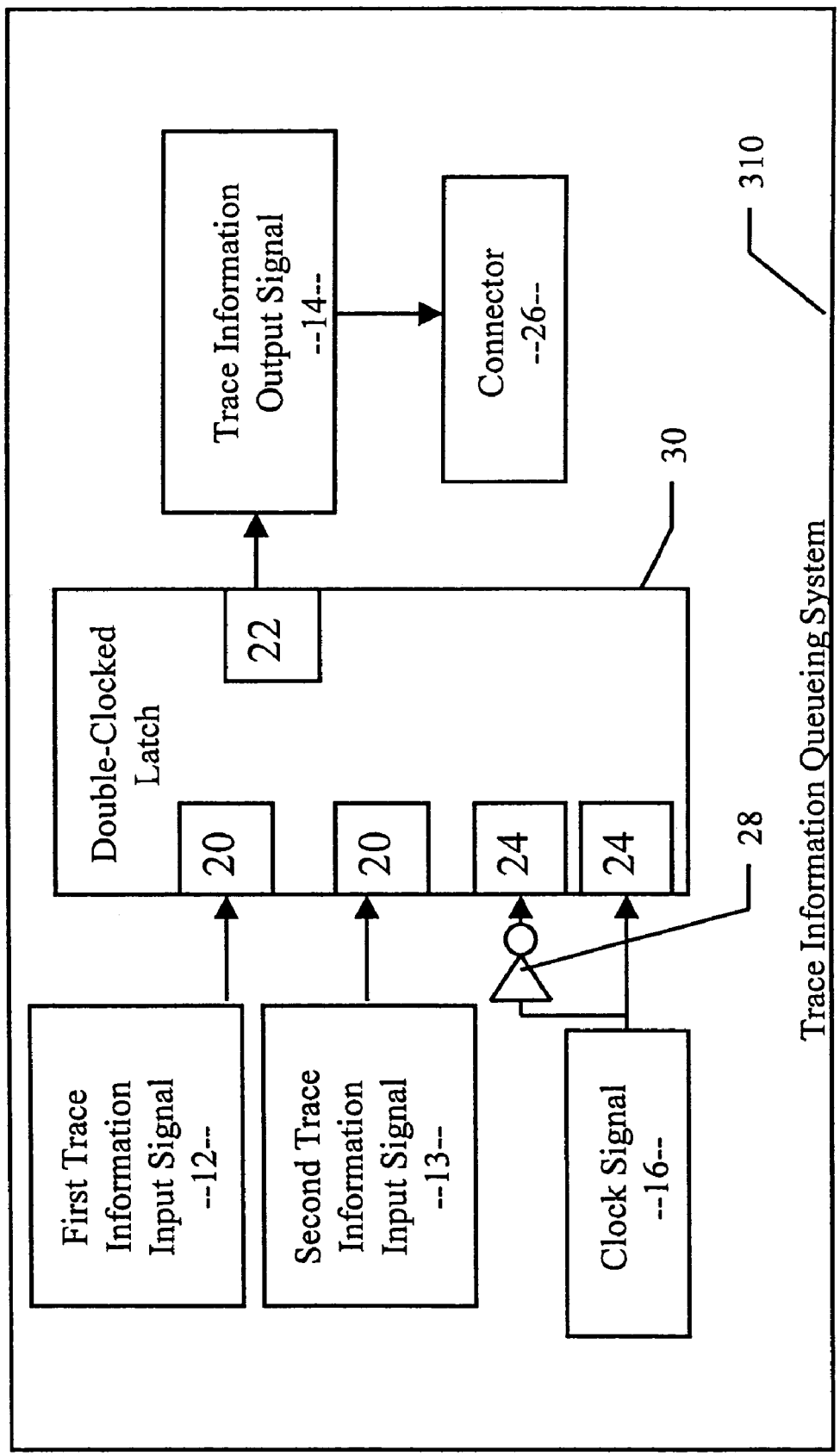
FIG. 3 is a schematic diagram of the trace information queueing system of FIG. 2 utilizing a double-clocked latch as the queueing device.

Another exemplary implementation of the invention is illustrated in the block diagram of FIG. 2. The trace information queueing system 210 includes an inverter 28 and an additional enable pin 24. In this embodiment of the invention, transmitting the first trace information input signal 112 to the signal output 24 would be triggered by one edge of the clock signal 16 and the transmission of the second trace information input signal 113 would be triggered by the other edge of the clock. The schematic diagram of FIG. 3 illustrates such as embodiment with the trace information queueing system 310 utilizing a double-clocked latch 30 as the queueing device 18.

Figure 4:
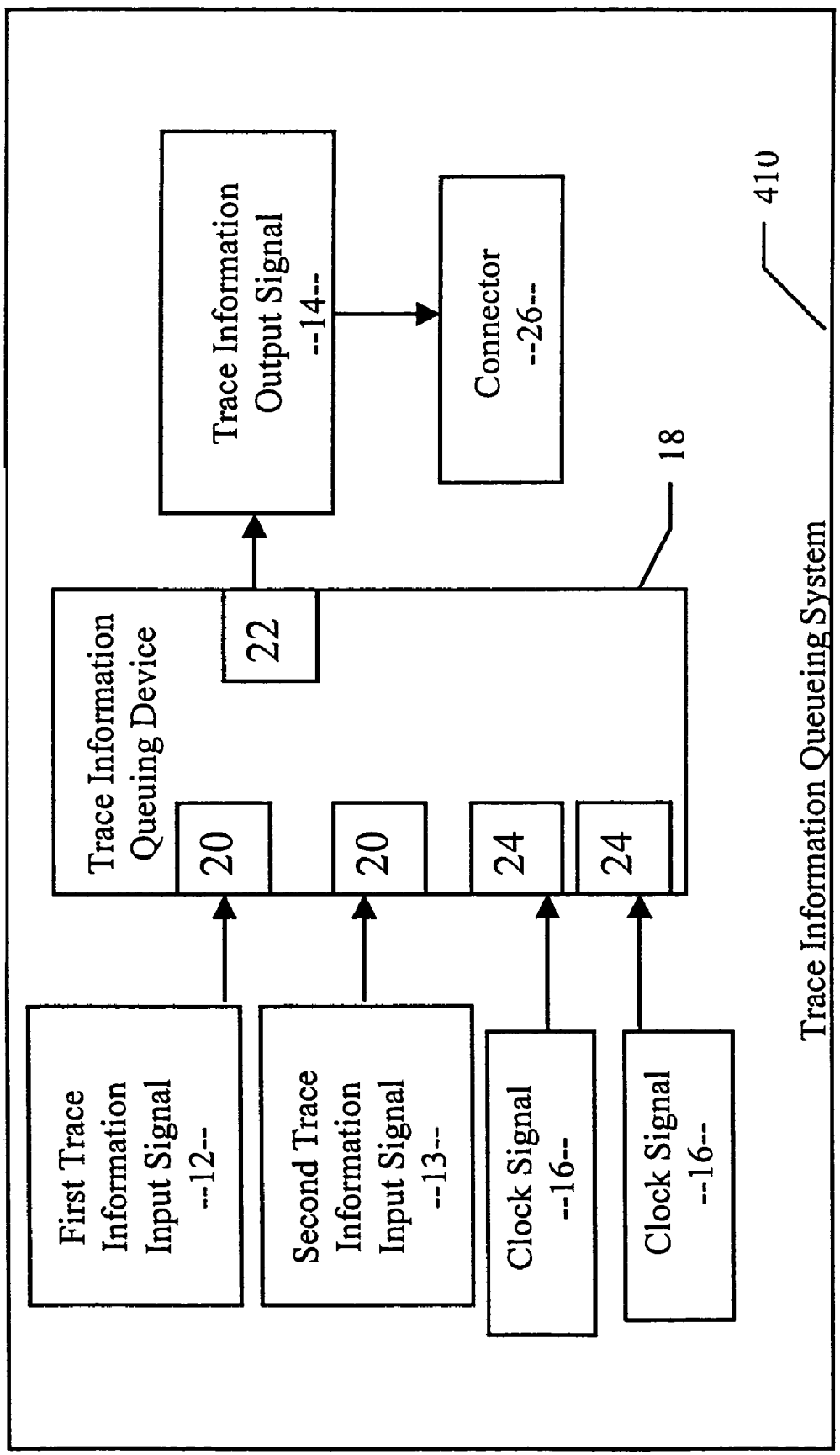
FIG. 4 is a block diagram of a trace information queueing system similar to that of FIG. 2, but with multiple clock signals.

FIG. 4 is a block diagram illustrating a trace information queueing system 410 similar to that illustrated in FIG. 2. However, each trace information input signal 112, 113 has its own associated clock signal 16. In this manner, the queueing system 410 may be expanded with multiple input signals being transmitted according to a like number of clock signals. The number of input signals and corresponding clock signals is limited only by the set-up time and hold-time requirements of the queueing device and the signal responsiveness of the electric pathways carrying the signals.

Figure 5:
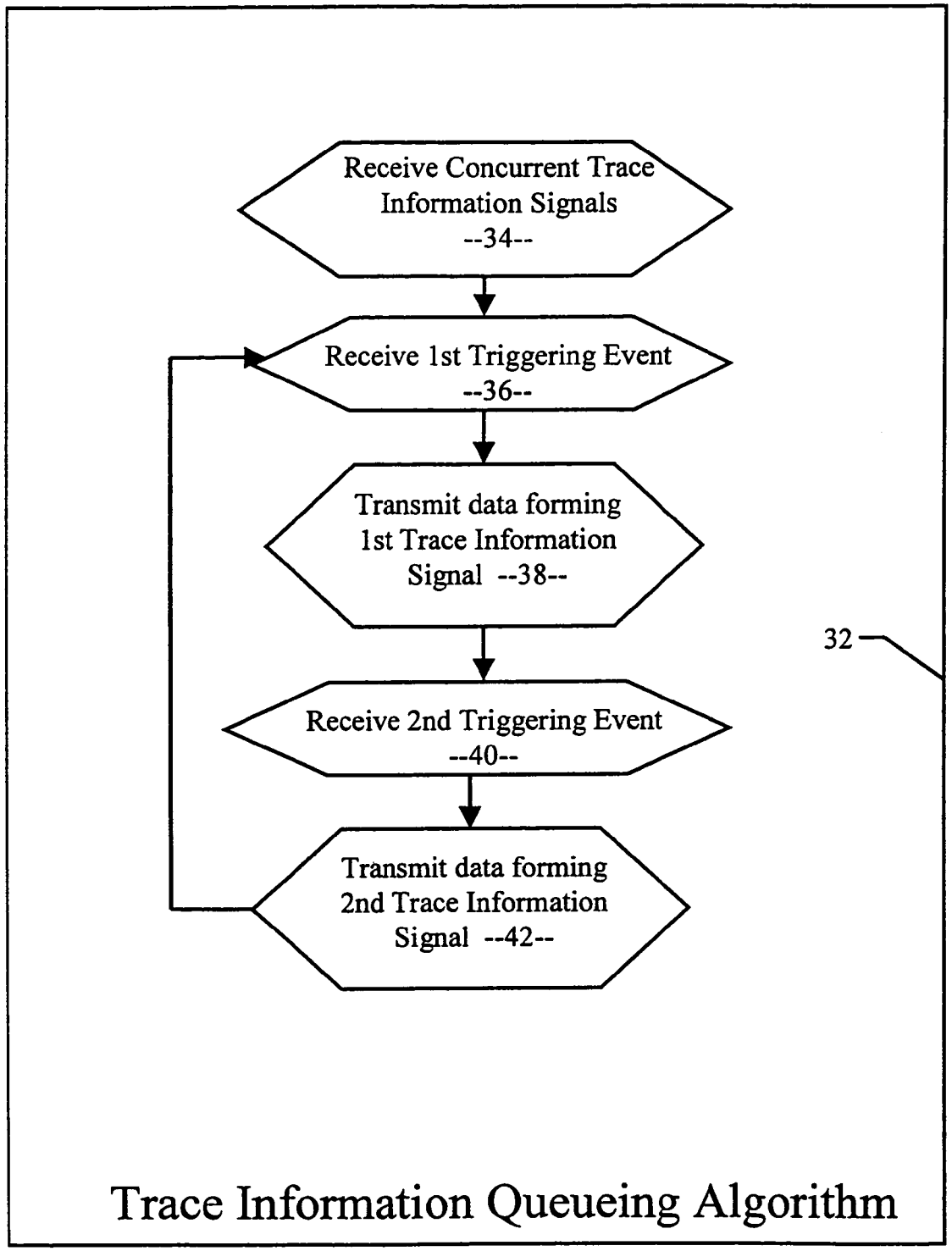
FIG. 5 is a flow-chart illustrating the process of accepting multiple trace information input signals, transmitting data forming one of the trace information input signals in response to a first triggering event, and transmitting data forming each subsequent trace information signal in response to other disparate triggering events, using a common output device.

FIG. 5 is a flow-chart illustrating a deferred transmission algorithm 32 including receiving concurrent trace information input signals (step 34), receiving a first triggering event (step 36), transmitting data forming a first trace information signal (step 38), receiving a second triggering event (step 40) and transmitting data forming a second trace information signal (step 42). The algorithm may be expanded to include more than two trace information input signals. When data from the last trace information input signal has been transmitted, the algorithm returns to step 36, waiting for a re-occurrence of the first triggering event so that it may cycle through the transmission steps recursively.

Those skilled in the art of making status information tracking systems may develop other embodiments of the present invention. The terms and expressions which have been employed in the foregoing specification are used herein as terms of description and not of limitation, and there is no intention in the use of such terms and expressions of excluding equivalents of the features shown and described or portions thereof, it being recognized that the scope of the invention is defined and limited only by the claims which follow. Other embodiments of the invention may be implemented by those skilled in the art of transmitting trace information.

We claim:

1. A trace information queuing system, comprising:
a computer processing device comprising a queuing device including a first input, a second input, and an output;
a first input signal, generated by a first electronic component, the first input signal comprising trace information indicating a condition of the first electronic component, the first input signal electrically connected to said first input;
a second input signal, generated by a second electronic component, the second input signal comprising trace information indicating a condition of the second electronic component, the second input signal electrically connected to said second input;
a device for producing a first triggering event; and
a device for producing a second triggering event;
a first clock signal;
wherein, said queuing device is a single double-clocked latch having a first enable pin, a second enable pin, an inverter coupled to said second enable pin, a first clock input configured to enable transmission of a signal from said first input to said output upon detection of a rising edge on said first clock input, and a second clock input configured to enable transmission of a signal from said second input to said output upon detection of a rising edge on said second clock input, wherein said first input signal is passed to said output in response to said first triggering event and said second input signal is passed to said output in response to said second triggering event; and wherein the first clock signal is passed through the inverter producing an inverted clock signal, the first clock signal is connected to the first enable pin and the inverted clock signal is connected to the second enable pin, and the first triggering event is an edge of the first clock signal and the second triggering event is an edge of the inverted clock signal.

2. The trace information queuing system of claim 1, wherein the computer processing device includes an algorithmic construct for producing the first triggering event and the second triggering event.

3. The trace information queuing system of claim 2, wherein the computer processing device is a programmable logic device.

4. The trace information queuing system of claim 3, wherein the programmable logic device is a field-programmable gate-array (FPGA).

5. The trace information queuing system of claim 4, wherein the algorithmic construct causes the field-programmable gate-array (FPGA) to produces a first clock signal to generate said first triggering event and a second clock signal to generate said second triggering event.

6. The trace information queuing system of claim 1, wherein the device for producing a first triggering event and the device for producing a second triggering event is the same device, which produces a single clock signal that is split into a first clock signal and a second clock signal, wherein the double-clocked latch includes an inverter that receives said second clock signal, and wherein the second triggering event is a falling edge of the first clock signal.

7. The trace information queuing system of claim 1, wherein the first triggering event is a first voltage of a clock signal within a first voltage range and the second triggering event is a second voltage of the clock signal within a second voltage range.

8. The trace information queuing system of claim 7, further comprising a third input signal, generated by a third electronic component, the third input signal comprising trace information indicating a condition of the third electronic component, and a device for producing a third triggering event and wherein the queuing device further comprises a third input and the third input signal is electrically connected to the third input and said third input signal is passed to said output in response to said third triggering event.

9. The trace information queuing system of claim 8, wherein the third triggering event is a third voltage of the clock signal within a third voltage range.

10. The trace information queuing system of claim 1, wherein the first input signal and the second input signal each include a plurality of electrical signals.

11. The trace information queuing system of claim 1, further comprising a first enable pin and a second enable pin and wherein the first triggering event is an edge of a first clock signal electrically connected to the first enable pin and the second triggering event is an edge of a second clock signal electrically connected to the second enable pin.

12. The system of claim 1, further comprising a printed circuit board having a connector, wherein the computer processing device, the first electronic component, and the second electronic component are arranged on said printed circuit board, and wherein the output is electrically connected to the connector.

13. The system of claim 1 wherein either the trace information indicating a condition of the first electronic component or the trace information indicating a condition of the second electronic component includes information about: the arrangement of electronic components within an electronic system, the current activity of the electronic components within an electronic system, the contents of memory registers within the first or second electronic components, or whether electric faults exist.

* * * * *